(12) United States Patent
Driedger et al.

(10) Patent No.: US 6,360,078 B1
(45) Date of Patent: Mar. 19, 2002

(54) METHOD OF COMPENSATING FOR GROUP TIME DELAY ASYMMETRY IN A RADIO RECEIVER

(75) Inventors: Mark Elwood Driedger, Dunrobin; Wolfgang Oberhammer, Ottawa; Song Zhang, Nepean, all of (CA)

(73) Assignee: Nortel Networks Limited, St. Laurent, CA (US)

( * ) Notice: Subject to any disclaimer, the term of this patent is extended or adjusted under 35 U.S.C. 154(b) by 0 days.

(21) Appl. No.: 09/219,458

(22) Filed: Dec. 23, 1998

(51) Int. Cl.[7] ............................................. H04B 17/00
(52) U.S. Cl. ................. 455/67.6; 455/226.1; 455/258; 342/457
(58) Field of Search ........................... 455/180.1, 180.2, 455/188.1, 188.2, 189.1, 190.1, 196.1, 197.1, 199.1, 254, 266, 67.6, 318, 319, 456, 226.1; 342/450, 457, 465

(56) References Cited

U.S. PATENT DOCUMENTS

| | | | | |
|---|---|---|---|---|
| 4,442,548 A | * | 4/1984 | Lehmann | 455/197 |
| 5,361,406 A | * | 11/1994 | Wignot et al. | 455/188.1 |
| 5,630,214 A | * | 5/1997 | Yamamoto et al. | 455/180.1 |
| 5,691,666 A | * | 11/1997 | Owen | 455/208 |
| 6,330,452 B1 | * | 12/2001 | Fattouche et al. | 455/67.6 |

* cited by examiner

Primary Examiner—Edward F. Urban
(74) Attorney, Agent, or Firm—Dennis R. Haszko; Foley & Lardner

(57) ABSTRACT

An RF receiver, which is one of a network of receivers, is described which allows for a simple method of compensating for the group time delay asymmetry of an IF filter in the receiver. Compensation of the group time delay is important for time difference of arrival (TDOA) measurements for mobile location tracking applications, such as E-911 applications. The TDOA measurements are performed by the receiver network. The RF receiver includes a switch which alternately switches between two RF LO frequencies for consecutive pulse signals received from a mobile transmitter. One of the two RF LO frequencies is offset by the IF frequency on the positive side of the center frequency of the mobile transmitter signal received by the receiver. The other RF LO frequency is offset by the IF frequency on the negative side of the center frequency. The group time delay of the IF filter may be compensated for by switching between the two RF LO frequencies, performing a time of arrival (TOA) measurement for the signals corresponding to each of the RF LO frequencies, and averaging the group time delays for each TOA. A TOA estimator causes the switch to switch an RF LO oscillator between the two RF LO frequencies. A method for compensating for the group time delay asymmetry corresponding to the receiver is also described.

12 Claims, 8 Drawing Sheets

METHOD OF COMPENSATING FOR GROUP TIME DELAY ASYMMETRY IN A RADIO RECEIVER

BACKGROUND OF THE INVENTION

This invention relates to a receiver for improving radio delay accuracy and an associated method.

In many wireless communications applications it is necessary to make accurate estimates of received signal delay for radio receivers. For, example, in wireless communications systems which use time difference of arrival (TDOA) measurements it is critical that an accurate estimate of the received signal delay can be determined. Such wireless communications systems include systems for mobile location tracking, ranging receivers such as radar, and systems where the propagation delay of the radio receiver must be known.

One application of mobile location tracking is Enhanced 911 (E-911) service, which includes the location of the emergency caller so that the emergency response to the mobile caller may be timely. An emergency caller calling from a cellular phone in an automobile may not be aware of his exact location, and may be too upset to determine that location. Mobile location tracking allows the location of the callers cellular phone (and the caller) to be determined, and the emergency caller may then be found that much more quickly.

The accuracy of mobile location tracking for E-911 services is important not only from a practical point of view, but also has been mandated by the FCC. Specifically, the FCC has mandated (Docket No. CC94-102) that all U.S. wireless providers must have the ability to locate an emergency mobile within 125 meter accuracy with 67% confidence by Oct. 1, 2001.

In addition to E-911 services, applications such as navigation services, roadside assistance, cargo tracking, and home zone-billing would benefit from mobile location tracking. Potentially, these other services could be built on top of an E-911 system.

In general, there are two approaches to mobile location tracking, a receiver network based approach, and a handset based solution. One advantage of a receiver network based approach over a handset based approach is that a receiver network based approach supports mobile handsets already in the market. The present invention takes a receiver network based approach.

Time difference of arrival (TDOA) measurements are one way of determining the location of a mobile transmitter (such as a cell phone) for mobile location tracking applications using a network based approach. For a TDOA measurement, the position of a mobile transmitter is determined by examining the difference in time at which a signal from the transmitter arrives at receivers in multiple base stations. Assuming the signal propagates in free-space, the range, $R_i$, from the transmitter to an ith receiver will be c times $t_{0i}$, where $t_{0i}$ is the time required for the signal to travel in a line from the transmitter to the ith receiver at the speed of light, c. Similarly, the range, $R_j$, from the transmitter to the jth receiver is $t_{0j}$ times c. For a given TDOA measurement for two particular receivers, the transmitter must lie on a hyperboloid with a constant range difference, $R_{i,j}=R_i-R_j$, of the two receivers given by the following equation (1):

$$R_{i,j}=\sqrt{(X_i-x)^2+(Y_i-y)^2+(Z_i-z)^2}-\sqrt{(X_j-x)^2+(Y_j-y)^2+(Z_j-z)^2}$$

where (x y z), ($X_i$ $Y_i$ $Z_i$), and ($X_j$ $Y_j$ $Z_j$) are the location coordinates of the transmitter, receiver i, and receiver j, respectively. The receiver coordinates are known and the transmitter coordinates may be determined using equation 1 if a sufficient number of independent TDOA measurements are performed. If the receivers are in the same plane (z is equal to a known constant), at least three receivers are required to determine the mobile transmitter location because two equations are required to solve for the x and y position variables. If the transmitter and receivers are not in the same plane, at least four independent TDOA measurements are required to fix the location of the transmitter which means that at least four base stations, each with a receiver are required.

FIG. 1 shows a two-dimensional hyperbolic position location solution where the transmitter and receivers are assumed to be in the same plane. In the network system of FIG. 1, three receivers, $S_1$, $S_2$, and $S_3$, receive a signal from a transmitter, T. The relative range of the transmitter to the receivers $S_1$ and $S_3$ is $R_{13}$. The relative range of the transmitter to the receivers $S_1$ and $S_2$ is $R_{12}$. The hyperboloids for the relative ranges, $R_{13}$ and $R_{12}$ are shown in FIG. 1 and are labeled as $R_{13}$ and $R_{12}$, respectively. The intersection of the hyperboloids is the location of the transmitter.

For a TDOA measurement the absolute time that a signal requires to travel from the transmitter to the receivers is not critical. Instead, TDOA measurements are based upon the difference in the time required for a signal to travel between the transmitter and one receiver from the time required to travel between the transmitter and another receiver. Because the difference in the time for the signal to travel must be known accurately, TDOA measurements require that the receivers have precisely synchronized clocks. Often atomic clocks such as a Cesium time source are used.

Additionally, accurate TDOA measurements require that any time delay due to the receiver hardware be accurately accounted for. The measured difference in time, $t_{ij}$, that a signal from a transmitter requires to travel to receiver i compared with the travel time to receiver j (the time of arrival (TOA)) is given by the equation:

$$t_{ij}=(t_{0i}-t_{0j})+(t_{Ri}-t_{Rj}) \quad (2)$$

where $t_{0i}$ and $t_{0j}$ are the time for a signal to travel from the transmitter to receiver i and receiver j, respectively, and $t_{Ri}$ and $t_{Rj}$ are the delay time due to the receiver hardware of receivers i and j, respectively. Ideally, all the receivers involved in a TDOA measurement would have the same hardware delay time and the contribution to the measured difference in time, $t_{ij}$, from the hardware would be zero, i.e., $t_{Ri}-t_{Rj}=0$. Alternatively, if the hardware delay time of each receiver were different, but fixed and known, the difference in delay time between receivers could be readily compensated for.

All radio frequency (RF) analog components contribute to the group time delay incurred by the mobile transmitter signal until it is digitized. Wide band receiver hardware elements such as amplifiers have short stable delays. The delays due to these wide band hardware elements are either negligible or may be readily accounted for. Filters, on the other hand, will have a larger delay, which varies from unit to unit, and over time and temperature. Consequently, the group time delay profile at different receivers becomes intractable, which may significantly impact locating performance. A particularly difficult problem is the first intermediate frequency (IF) filter employed in a heterodyne receiver chain. This filter is typically fairly high order to provide image rejection. Typical technologies for these filters are surface acoustic wave (SAW) and crystal filters. These filters may exhibit asymmetry with respect to the IF frequency and this asymmetry may vary with temperature and time.

One attempt to solve the problem with IF filters requires extensive calibration and correction for IF filter response and variation with temperature based on manufacturing measurements. This is time consuming and does not account for variation in IF filter behavior with time. Another approach is to increase the specs on the IF filter. However, this drives up product cost and may provide less IF rejection.

SUMMARY OF THE INVENTION

It is an object of one embodiment of this invention to provide a method for compensating for the asymmetrical group time delay of an IF filter in a radio receiver for TDOA measurements by performing two time of arrival (TOA) measurements. In the first TOA measurement the time delay is measured when the receiver uses a RF LO frequency equal to the center RF frequency of the signal received by the receiver minus the IF frequency, and in the second TOA measurement the receiver uses a RF LO frequency equal to the center RF frequency plus the IF frequency. The asymmetry of the IF filter is compensated for by using the two TOA measurements. In one aspect of this embodiment the time delay of the two TOA measurements is averaged. This method easily compensates for IF filter asymmetry which may vary with temperature, or over time because consecutive signals received by the receiver from a transmitter may be used for the two TOA measurements.

It is another object of one embodiment of this invention to provide a method of compensating for the group time delay of an IF filter in a radio receiver for TOA measurements which neither requires an expensive IF filter with high specs, or extensive calibration of an IF filter to determine its group time delay response.

It is another object of another embodiment of this invention to provide for a radio receiver which may compensate for the asymmetrical group time delay of an IF filter by including a switch in the radio receiver which switches between a first RF LO frequency and a second RF LO frequency. The switch may automatically switch between the first and second RF LO frequencies for consecutive signal bursts received. The receiver includes a mixer which downconverts a signal in the radio receiver according to the frequency of the local oscillator. The receiver may also include a demodulator and a TOA estimator connected to the demodulator and to the switch for receiving a demodulated signal from the demodulator and for causing as the switch to switch between the first frequency and the second frequency of the local oscillator.

It is another object of another embodiment of this invention to provide a method for compensating for the group time delay asymmetry of a component of a receiver in a TOA measurement. In this embodiment a first signal is downconverted to a first converted frequency signal by a first oscillator frequency, and a second signal is also downconverted to a second converted frequency signal. Both the first converted frequency signal and the second converted frequency signal are passed through the component with the group time delay asymmetry. A TOA measurement is performed for both the first and second signals, and the group time delay of the component is compensated for using the first and second TOA measurements. For example, the group time delay may be compensated for by averaging the group time delay for the first and second TOA measurements.

It is another object of yet another embodiment of this invention to provide for a receiver which may compensate for the asymmetrical group time delay of the component in the receiver by including a switch in the receiver which may switch between two frequencies of the oscillator. The receiver includes a mixer which downconverts a signal in the receiver according to the frequency of the oscillator. The component transforms the downconverted signal to a converted signal, and the component exhibits group time delay asymmetry. The first oscillator frequency is equal to the center frequency of the signal received by the receiver minus the frequency of the downconverted signal. The second oscillator frequency is equal to the center frequency plus the frequency of the downconverted signal. The switch preferably automatically switches between the first and second oscillator frequencies for consecutive signal bursts received. The receiver may also include a TOA estimator connected to the component and to the switch for receiving the converted signal from the component and for causing the switch to switch between the first and second frequencies of the oscillator.

It is another object of yet another embodiment of this invention to provide for a receiver network for mobile location tracking having receivers and a central processing center for receiving time of arrival values from the receivers, where each receiver may compensate for the asymmetrical group time delay of an IF filter.

DETAILED DESCRIPTION OF THE PREFERRED EMBODIMENTS

Figure 2:
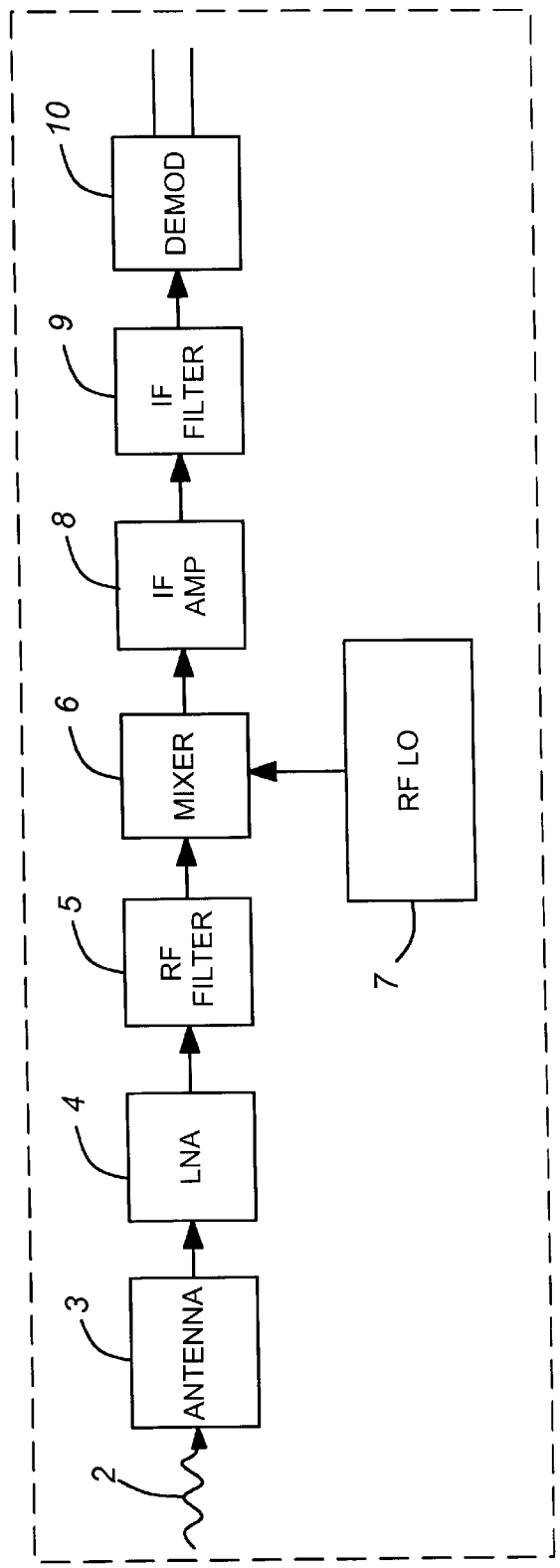
FIG. 2 is a block diagram of a typical RF receiver.

FIG. 2 is a block diagram of a typical RF receiver. Specifically, FIG. 2 shows an RF receiver 1. The signal 2 from a mobile transmitter is received by an antenna 3. The mobile signal then passes through a low noise amplifier (LNA) 4. An RF filter 5 with a typical bandwidth of 25 MHz filters the signal coming from the LNA. A typical RF signal would be centered in frequency at about 880 MHz. The signal is then downconverted in frequency to an IF frequency at the mixer 6 by mixing with the radio frequency local oscillator (RF LO) 7 signal. A typical IF frequency would be centered at about 85 MHz, which would correspond to a RF LO frequency of 795 MHz. At this stage, prior to filtering through the IF filter, the bandwidth of the IF signal would be the same as that of the RF signal, i.e., 25 MHz in this case. The IF signal is then amplified at the IF amp 8, and then is filtered by a narrow band IF filter 9 to reject image signals and signals on other channels. A typical bandpass for the IF filter is 30 kHz, which for an IF bandwidth of 25 MHz corresponds to 832 channels. The filtered IF signal, with a bandwidth of 30 kHz, now goes through demodulator 10 to become baseband in-phase and quadrature signals.

Figure 3:
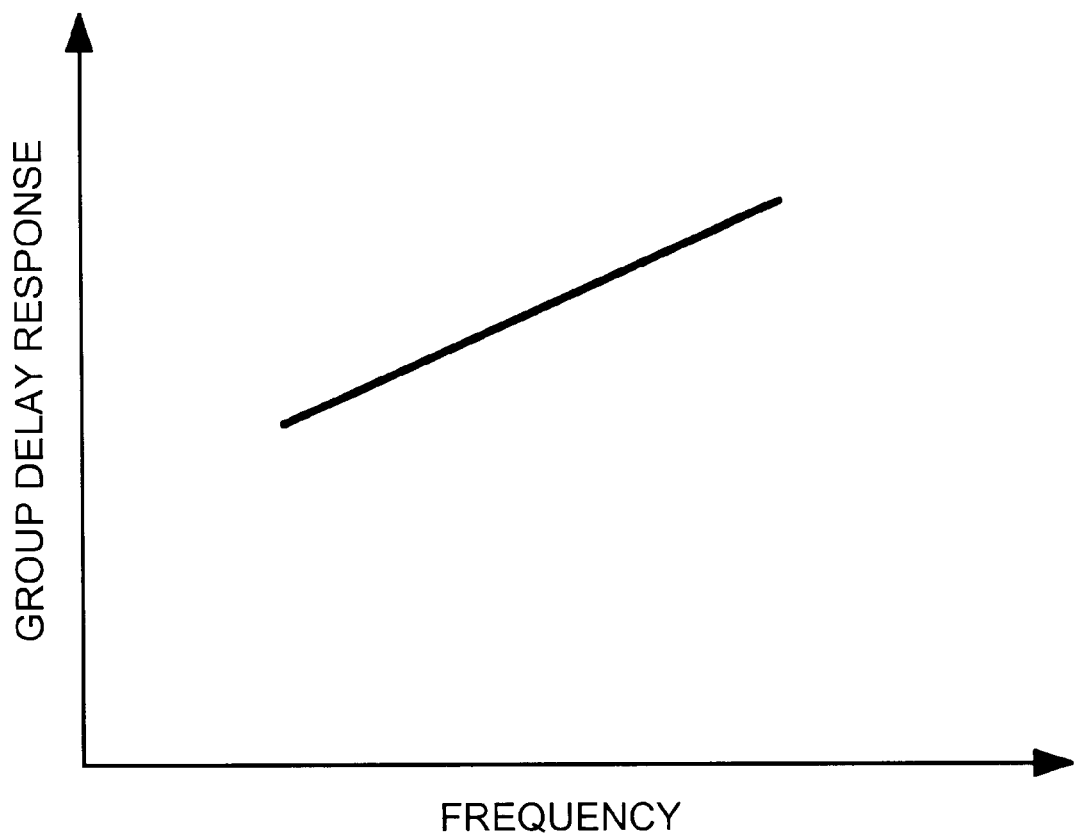
FIG. 3 is a diagram showing an asymmetric group delay response due to an IF filter.

However, because the IF filter is narrow-band and of a high order nature, the IF filter may exhibit an asymmetric group delay response with respect to the IF frequency, and the asymmetry may vary with temperature. Once the signal goes through the IF filter, the asymmetric group time delay characteristic will be reflected in the signal and eventually affect the TOA measurements, and ultimately the TDOA measurements. FIG. 3 shows an asymmetric group delay response for an IF filter. The effect of this asymmetric group delay response on an IF signal will be discussed later with respect to FIGS. 5A–5E.

Figure 4:
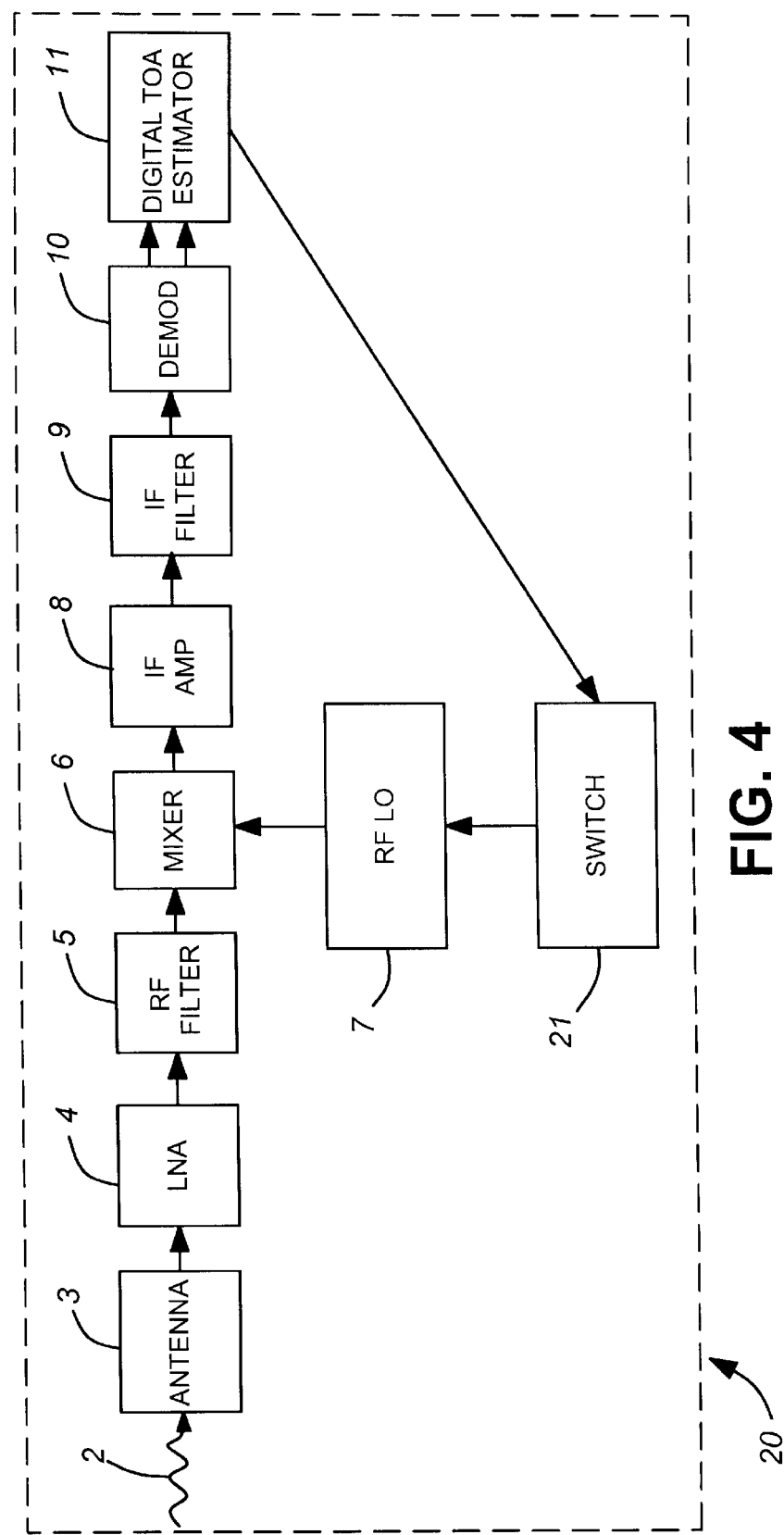
FIG. 4 is a block diagram of an improved RF receiver according to one embodiment of the invention.

FIG. 4 shows a block diagram of an improved RF receiver according to one embodiment of the invention. Specifically, FIG. 4 shows an improved RF receiver 20. The signal 2 of a mobile transmitter is received by an antenna 3. The mobile signal then passes through an LNA 4. An RF filter 5 with an exemplary bandwidth of 25 MHz filters the signal coming from the LNA. For example, the RF filter may be a surface acoustic wave (SAW) filter. The RF signal has a bandwidth of 25 MHz with an exemplary center frequency of about 880 MHz. The signal is then downconverted in frequency to an IF frequency at the mixer 6 by mixing with the radio frequency local oscillator (RF LO) 7 signal.

Up to this point the improved RF receiver of FIG. 4 is similar to the typical RF receiver of FIG. 2. However, unlike the typical RF receiver of FIG. 2, the improved RF receiver of FIG. 4 has a switch 21 at the mixer which switches between two controlled RF LO frequencies to compensate for the asymmetric group delay of the IF filter. Thus, in contrast to the typical RF receiver, the improved RF receiver of FIG. 4 can make time delay measurements for two different RF LO frequencies instead of time delay measurements for a single RF LO frequency. The two RF LO frequencies are separated by twice the IF frequency and centered at the center RF frequency. The RF LO frequency shifted down from the center RF frequency is the low side RF LO frequency, while the RF LO frequency shifted up from the center RF frequency is the high side RF LO frequency. For exemplary IF and RF frequencies of 85 MHz and 880 MHz, respectively, the low side and high side RF LO frequencies are 795 and 965 MHz, respectively.

The switch is preferably controlled to automatically switch between the high side and low side RF LO frequencies alternatively for every incoming signal burst from a mobile transmitter. However, the switch may be controlled to switch in a different fashion. For example, the switch may be activated on every second burst which comes in from the mobile transmitter, or in some other fashion.

The IF signal is amplified at the IF amp 8, and then is filtered by a narrow band IF filter 9 to reject image signals and signals on other channels. The IF filter may be a SAW filter or a crystal filter, for example. An exemplary bandpass for the IF filter is 30 kHz, which for an IF bandwidth of 25 MHz corresponds to 832 channels. The filtered IF signal, with a bandwidth of 30 kHz, now goes through demodulator 10 where it is demodulated to become baseband in-phase and quadrature signals. The demodulator 10 is connected to a digital TOA estimator 11. The signals from the demodulator are input into the TOA estimator 11. The TOA estimator 11 may cause the switch to switch the RF LO between two RF LO frequencies for different signal bursts measured by the TOA estimator 11.

A typical switching of the RF LO oscillator of the network receiver of FIG. 4 occurs in the following fashion. When a location receiver of the network, such as that embodied in FIG. 4, tries to measure a mobile transmitter's TOA based upon the burst timing derived by the TOA estimator, the RF LO is controlled to switch between the high and low side of the RF center frequency, alternatively for every incoming mobile transmitter signal burst. The TOA estimator may control the switch based upon a sync word with the signal bursts. The sync word is a short piece of known signal within a signal burst. The TOA estimator establishes slot (burst) timing based on the sync word. Once the slot time is established, the TOA estimator will know when the next burst will arrive, and will be able to control the switch accordingly.

By switching the RF LO frequency, the signal spectrum presented to the IF filter is mirrored around it center frequency relative to that of the previous burst. The TOA estimator can average the TOA estimates obtained from two continuous bursts to effectively compensate asymmetry of the IF filter group delay response. The IF filtering effect on the signal spectrum is illustrated in FIGS. 5A–5E.

Figure 5A:
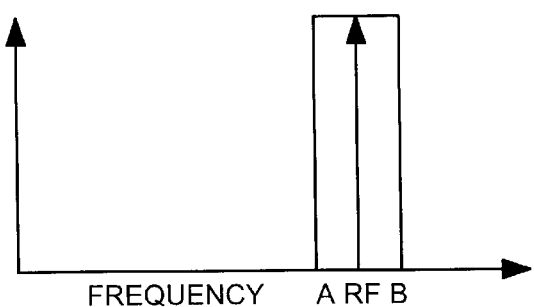
FIGS. 5A–5E illustrate the effect of IF filtering on the signal spectrum and asymmetric spectrum compensation according to an embodiment of the present invention.

FIGS. 5A–5E illustrate the effect of IF filtering on the signal spectrum and asymmetric spectrum compensation according to an embodiment of the present invention. FIG. 5A shows an RF signal spectrum. For simplicity in detailing the asymmetric spectrum compensation according to this invention, the RF signal spectrum of FIG. 5A is shown with a square shaped wave packet envelope. Of course, in practice the wave packet envelope of the RF signal spectrum may have other shapes. For example the envelope may be more bell shaped than square shaped, or may have other shapes. The arrow marked RF identifies the center of the wave packet, while B and A mark the high and low frequency sides, respectively, of the wave packet. The envelope is typically symmetric about the center frequency RF.

Figure 5B:
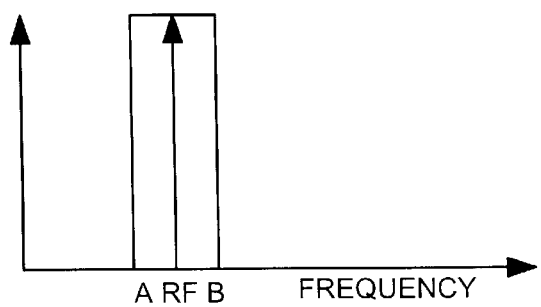

FIG. 5B shows the signal spectrum once it has been downconverted by mixing with the high side RF LO frequency. The signal spectrum of FIG. 5B has been shifted down in frequency and has a center frequency at the IF frequency. The high side portion of the wave packet spectrum of the RF signal remains the high side portion of the wave packet spectrum of the IF signal in FIG. 5B, i.e., B remains on the high side, and A remains on the low side.

Figure 5C:
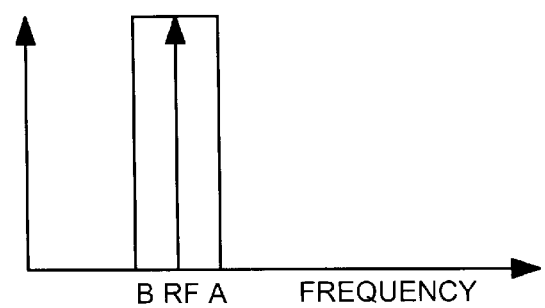

FIG. 5C shows the signal spectrum once it has been downconverted by mixing with the low side RF LO frequency. Like the signal spectrum of FIG. 5B, the signal spectrum of FIG. 5C has been shifted down in frequency and has a center frequency at the IF frequency. However, unlike the signal spectrum of FIG. 5B, in the signal spectrum of FIG. 5C, the high side portion of the wave packet spectrum of the RF signal has been flipped to the low side of the wave packet spectrum of the IF signal, i.e., B has been flipped from the high side to the low side, and A has been flipped from the low side to the high side. Thus, the IF signal of FIG. 5C is a mirror image of the IF signal of FIG. 5B, where the signals are mirrored about the IF frequency.

Figure 5D:
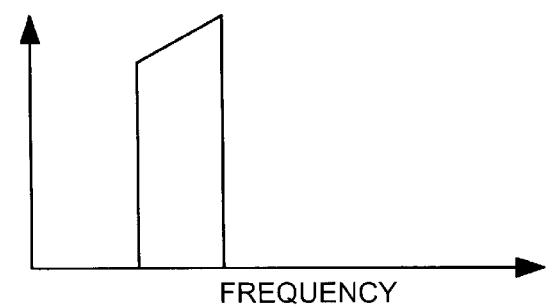

FIG. 5D shows an asymmetric group delay response as a function of frequency, which is typical of the IF filter. In this case, the response has an upward slope. In practice, the group delay response of the filter may vary from filter to filter and over time and temperature. The response need not have a constant slope, and may slope downward with increasing frequency.

Figure 5E:
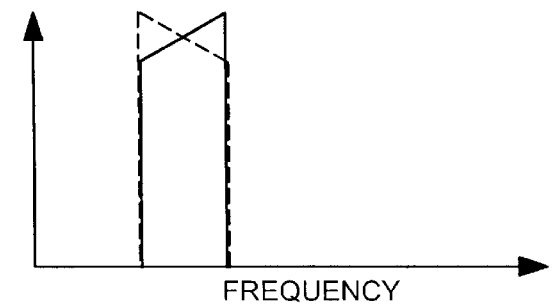

FIG. 5E shows the effect the filter has upon the two IF signals of FIGS. 5B and 5C, respectively. The signal of the solid line corresponds to the signal of FIG. 5B, while the signal of the dashed line corresponds to the signal of FIG. 5C. Because the response of FIG. 5D shows an upward slope with increased frequency, the signal of FIG. 5B, which has B as the high side frequency, when passed through the IF filter will have a wave packet envelope with an upward sloping shape. By contrast, when the signal of FIG. 5C is passed through the filter, the wave packet envelope will have a downward sloping shape, because the high side B has been flipped to the low side. By averaging these two burst signals, the TOA estimator may compensate for the asymmetry without having to account for the specific response shape of the filter.

The change in RF LO will not affect other delays in the hardware elements of the receiver chain, such as the delays due to amplifiers, so no compensation should be necessary for components other than the IF filter. This makes modification of a typical receiver to incorporate switching between the two RF LO frequencies fairly simple to carry out. Also, because the IF filter asymmetry is compensated for by means of switching between two RF LO frequencies, there is no need to design the IF filter to reduce filter group delay asymmetry. This is an advantage because IF filters designed to reduce filter group delay asymmetry have to be designed to have wider bandwidth, which will impact on some receiver specifications or may even lead to a completely different receiver architecture.

Figure 1:
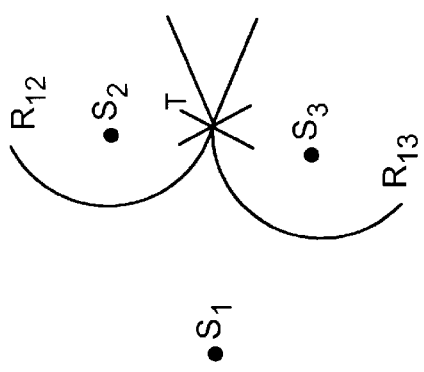
FIG. 1 is a diagram showing a two-dimensional hyperbolic position location solution for a transmitter and three receivers.
Figure 6:
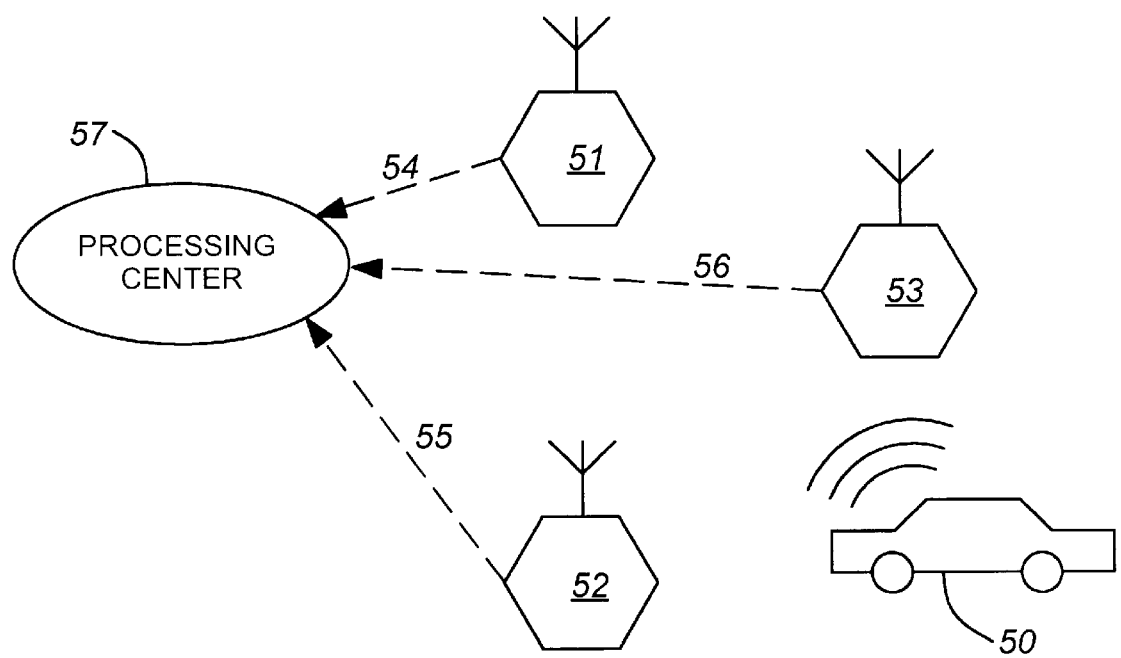
FIG. 6 is a diagram of receiver network for mobile location tracking using TDOA measurements.

FIG. 6 shows an example of a receiver network for mobile location trackiing using TDOA measurements. Cell-sites 51, 52, and 53, receive a mobile transmitter signal from a mobile 50, such as from a cell phone in an automobile. Each receiver, such as the receiver of FIG. 4, estimates the time of arrival (TOA) of the mobile transmitter signal. The TOAs 54, 55, and 56, as measured at the cell-sites 51, 52, and 53, respectively, are then sent to a central processing center 57 where TDOAs are extracted and the mobile location is estimated by the hyperbolic locating technique as discussed with regards to FIG. 1.

The TOAs as measured at the cell-sites in FIG. 6, are measured using the two RF LO method of compensating for asymmetry in the IF filter response as discussed earlier. Thus any asymmetry in the IF filter response is compensated for prior to sending the TOAs to the processing center 57. Because the asymmetry of the IF filter response has been removed, each receiver should have the same group delay profile. In other words, $t_{R_i}$ and $t_{R_j}$ of Equation 2 are the same for any of receivers i and j. Thus, the TDOA value for receivers i and j will be simply the difference in propagation time of the mobile signal to receivers i and j.

Figure 7:
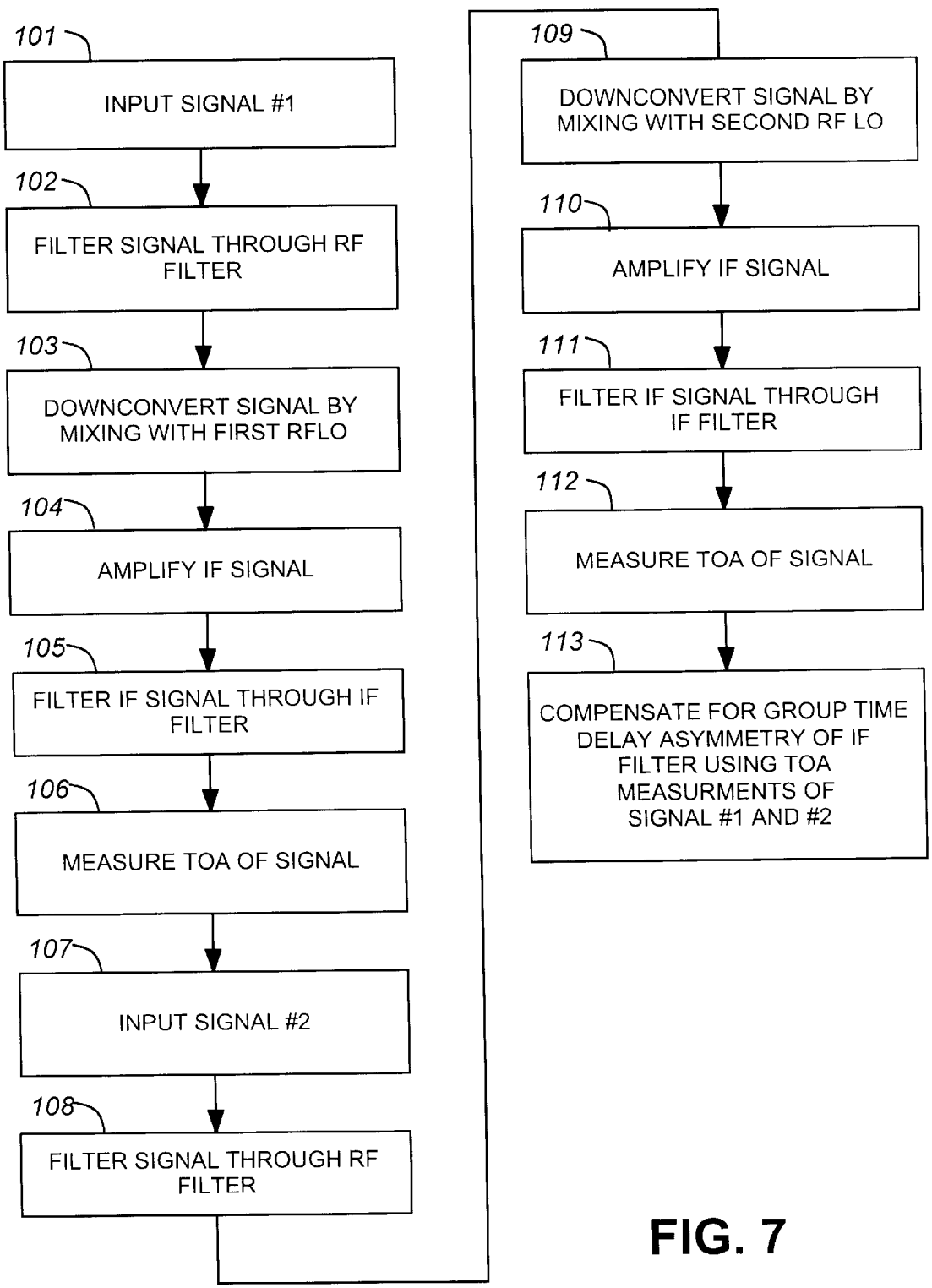
FIG. 7 is an outline of the steps for a method according to another embodiment of the invention.

FIG. 7 is an outline of the steps of an embodiment of this invention which compensates for an IF filter group time delay asymmetry. In step 101, a first signal, signal #1, is input into the receiver system. Then, in step 102, signal #1 is passed through the RF filter to filter out undesired components of the input signal. In step 103, the RF filtered signal is downconverted to a first IF frequency signal, IF signal #1. The RF filtered signal is downconverted by mixing with the first RF LO frequency signal, RF LO #1, where RF LO #1 is equal to the center RF frequency minus the IF frequency. IF signal #1 is amplified in step 104, and then filtered by the IF filter in step 105. A TOA measurement of signal #1 is then made in step 106. The TOA measurement will include the hardware time delay due to the receiver system since the signal has passed through the hardware. Steps 107–112 are the same as steps 101–112, except a second signal, signal #2 is processed, and in step 109, the signal #2 is downconverted by mixing with a second RF LO frequency signal, RF LO #2, where RF LO #2 is equal to the center RF frequency plus the IF frequency.

After having completed step 112, we now have two TOA measurements, a first measurement where the time delay due to the IF filter is for an IF frequency which has been downconverted by mixing with RF LO #1, and a second measurement for an IF frequency downconverted by mixing with RF LO #2. The asymmetry in the group time delay due to the filter can now be compensated for by averaging the group delays for the first and second measurements as shown in step 113. This method will compensate for any changes in the IF filter asymmetry which depend upon time or temperature, or upon the particular IF filters characteristics, because the effects of the asymmetry are automatically compensated for by averaging the group delay for consecutive TOA measurements.

Figure 8:
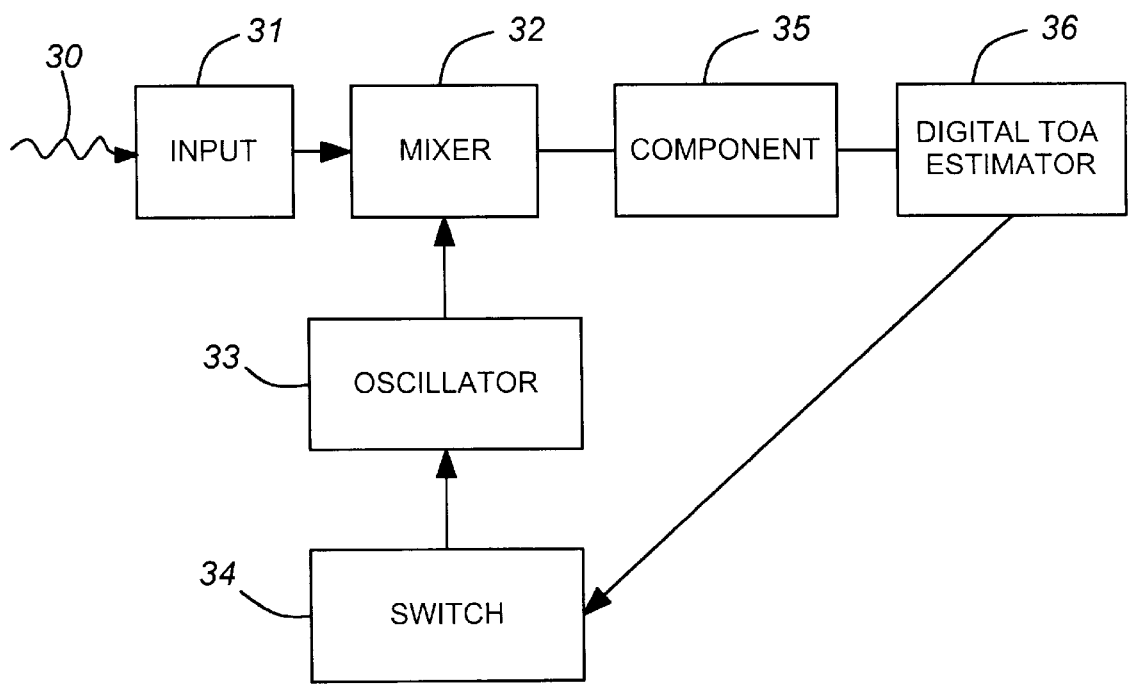
FIG. 8 is a block diagram of a receiver according to yet another embodiment of the invention.

This invention is not limited to compensating for the asymmetry in group delay for an IF filter, but is generally applicable to compensating for the asymmetry in group delay for hardware components which exhibit asymmetry in group delay. FIG. 8 shows a receiver according to another embodiment of this invention which is generally applicable to components which exhibit asymmetry in group delay. In FIG. 8, a signal 30, with a center frequency, is input into the input 31 of the device. The input 31 may include an antenna. The signal is then converted to a first converted frequency at a mixer 32. The conversion to the first converted frequency is performed by mixing with the frequency signal of an oscillator 33. The signal is shifted in frequency according to the frequency of the oscillator 33. The frequency of the oscillator may be switched between two oscillator frequencies by means of the switch 34.

The first converted frequency signal is passed through the component 35 and transformed to a second converted signal, and a TOA measurement may then be performed on the signal coming from the component 35. The TOA measurement will include any time delay due to the receiver hardware including that due to component 35. The component 35 exhibits asymmetry in group time delay. The component 35 is ultimately connected to a TOA estimator 36. There may be intervening components between the component 35 and the TOA estimator 36, such as a demodulator. The second converted signal from the component 35 passes ultimately to the TOA estimator 36. The asymmetry in the component 35 is compensated for by performing two TOA measurements with the device of FIG. 8. In the first measurement the oscillator has a frequency which is equal to the input center frequency minus the first converted frequency. In the second measurement, the frequency of the oscillator is switched by means of the switch 34 to the input center frequency plus the first converted frequency. Of course, the first and second measurements may be performed in either order. The TOA estimator 36 is connected to the switch and may cause the oscillator switch 34 to switch the oscillator between oscillator frequencies. Any asymmetry in the group time delay due to the component 35 may be averaged out by using two measurements centered about the input center frequency and offset by the first converted frequency.

Figure 9:
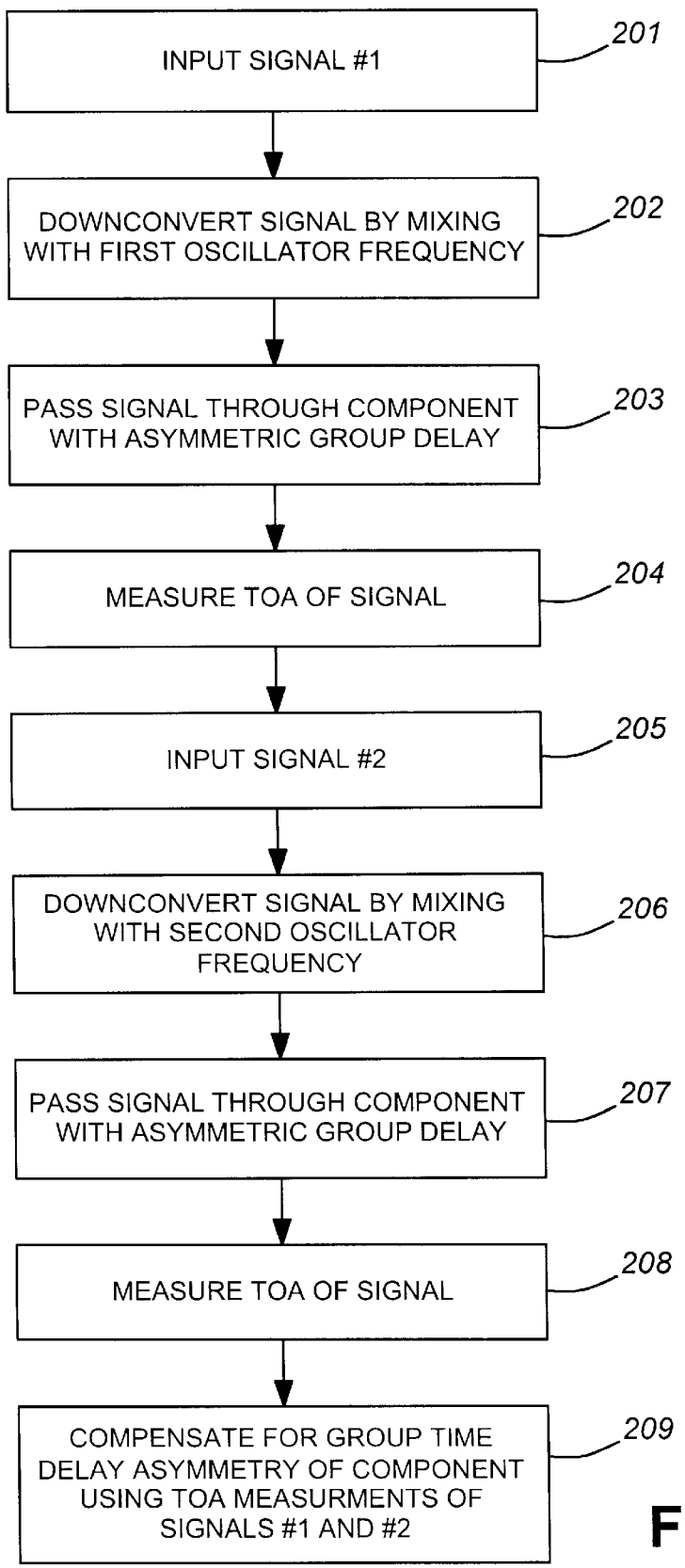
FIG. 9 is an outline of the steps for a method according to yet another embodiment of the invention.

FIG. 9 is an outline of the steps of an embodiment of this invention which compensates for component time delay asymmetry. In step 201, a first signal, signal #1, which has a center frequency is input into the receiver system. The first signal may originate from a mobile transmitter or some other transmitter, where it is desired to locate the transmitter. The first signal is downconverted into to a first converted frequency, converted frequency #1, in step 202, by mixing with a first oscillator frequency, oscillator frequency #1.

Oscillator frequency # 1 is equal to the center frequency minus converted frequency #1. The converted frequency #1 signal is then passed through a component in step 203, where the component has an asymmetric group delay. In step 204 a TOA measurement is performed on signal #1, which has passed through the component. The TOA measurement will include any time delay due to the receiver hardware including that due to the component. Steps 205–208 are the same as steps 201–204, except a second signal, signal #2, is processed, and in step 206, the signal #2 is downconverted by mixing with a second oscillator frequency, oscillator frequency #2, where oscillator frequency #2 is equal to the center frequency plus the converted frequency. Of course, steps 201–204 may be performed either before or after steps 205–208. In step 209, the asymmetry in the group time delay due to the component can now be compensated for, for example, by averaging the group time delays for the first and second TOA measurements.

Other embodiments of the invention are also envisioned. For example, two TOA measurements with a high side and low side RF LO frequency, respectively, may be performed, and correction factors for the asymmetry error for the IF filter thereby obtained. TOA measurements on subsequent unknown signals may consist of just a single TOA measurement, where the correction factors earlier derived are used to compensate for any asymmetry in the IF filter. The single TOA measurement will be most accurate when the earlier correction factor measurements are performed such that the IF filter is substantially at the same temperature and are performed under conditions where the IF filter asymmetry has not changed much over time.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one sklfied in the art to utilize the invention in various embodiments and with various modifications as are suited to the particular use contemplated. It is intended that the scope of the invention be defined by the claims appended hereto, and their equivalents.

What is claimed is:

1. A method of compensating for the group time delay asymmetry of an intermediate frequency (IF) filter of a radio frequency (RF) receiver in a time of arrival (TOA) measurement comprising:

downconverting a first RF filtered signal to a first IF frequency signal by a first radio frequency local oscillator (RF LO) frequency, where the first RF LO frequency is equal to a center frequency of the first RF filtered signal minus the frequency of the first IF frequency signal;

passing the first IF frequency signal through an IF filter;

performing a first TOA signal measurement;

downconverting a second RF filtered signal to a second IF frequency signal by a second RF LO frequency, where the second RF LO frequency is equal to a center frequency of the second RF filtered signal plus the frequency of the second IF frequency signal;

passing the second IF frequency signal through an IF filter;

performing a second TOA signal measurement;

compensating for any group time delay asymmetry in the IF filter using the first and second TOA measurements.

2. The method of claim 1, where the downconverting a first RF filtered signal step is performed subsequent to the downconverting a second RF filtered signal step.

3. The method of claim 1, further comprising:

filtering a first signal with an RF filter to form the first RF filtered signal;

filtering a second signal with the RF filter to form the second RF filtered signal.

4. The method of claim 3, further comprising:

receiving the first signal from a mobile transmitter using an antenna;

receiving the second signal from the mobile transmitter using the antenna.

5. The method of claim 1, further comprising:

amplifying the first IF frequency signal before the step of passing the first IF frequency signal through the IF filter;

amplifying the second IF frequency signal before the step of passing the second IF frequency signal through the IF filter.

6. The method of claim 1, wherein the compensating step comprises averaging the group time delay of the first and second signals.

7. The method of claim 1, further comprising:

performing a time difference of arrival (TDOA) measurement based at least in part upon the first and second TOA measurements, after the compensating step.

8. A method of compensating for the group time delay asymmetry of a component of a receiver in a time of arrival (TOA) measurement comprising:

downconverting a first signal to a first converted frequency signal using a first oscillator frequency signal, where the first oscillator frequency is equal to a center frequency of the first signal minus the frequency of the first converted frequency signal;

passing the first converted frequency signal through the component;

performing a first TOA signal measurement;

downconverting a second signal to a second converted frequency signal using a second oscillator frequency signal, where the second oscillator frequency is equal to a center frequency of the second signal plus the frequency of the second converted frequency signal;

passing the second converted frequency signal through the component;

performing a second TOA signal measurement;

compensating for any group time delay in the component using the first and second TOA measurements.

9. The method of claim 8, further comprising:

receiving the first signal from a mobile transmitter;

receiving the second signal from the mobile transmitter.

10. The method of claim 8, wherein the compensating step comprises averaging the group time delay of the first and second signals.

11. The method of claim 8, wherein the performing the first TOA measurement step is performed subsequent to the performing the second TOA measurement step.

12. The method of claim 8, further comprising:

performing a time difference of arrival (TDOA) measurement based at least in part upon the first and second TOA measurements, after the compensating step.

* * * * *